US006713837B1

(12) United States Patent
Mori et al.

(10) Patent No.: US 6,713,837 B1
(45) Date of Patent: Mar. 30, 2004

(54) SEMICONDUCTOR DEVICE WITH FUSE

(75) Inventors: Sadayuki Mori, Yokohama (JP);
Toshifumi Minami, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,594

(22) Filed: Mar. 10, 2000

(30) Foreign Application Priority Data

Mar. 12, 1999 (JP) .......................................... P11-067513

(51) Int. Cl.[7] ................................................ H01L 29/00
(52) U.S. Cl. ....................................................... 257/529
(58) Field of Search ................................. 257/758, 529

(56) References Cited

U.S. PATENT DOCUMENTS

| | | | |
|---|---|---|---|
| 5,760,674 A | 6/1998 | Gilmour et al. | |
| 5,773,869 A | 6/1998 | Froehner | |
| 5,895,963 A | * 4/1999 | Yamazaki | 257/529 |
| 6,084,304 A | * 7/2000 | Huang et al. | 257/762 |
| 6,100,118 A | * 8/2000 | Shih et al. | 438/132 |
| 6,133,628 A | * 10/2000 | Dawson | 257/698 |
| 6,137,155 A | * 10/2000 | Seshan et al. | 257/640 |
| 6,162,686 A | * 12/2000 | Huang et al. | 438/281 |
| 6,218,721 B1 | * 4/2001 | Niwa | 257/529 |
| 6,300,233 B1 | * 10/2001 | Lee et al. | 438/601 |
| 6,316,801 B1 | * 11/2001 | Amanuma | 257/306 |
| 6,320,262 B1 | * 11/2001 | Murakami | 257/758 |
| 6,337,517 B1 | * 1/2002 | Ohta et al. | 257/758 |
| 6,395,627 B1 | * 5/2002 | Hoshino et al. | 438/622 |

FOREIGN PATENT DOCUMENTS

| | | |
|---|---|---|
| JP | 09-036234 | 2/1997 |
| JP | 10-261720 | 9/1998 |

* cited by examiner

*Primary Examiner*—Tom Thomas
*Assistant Examiner*—Douglas W. Owens
(74) *Attorney, Agent, or Firm*—Finnegan, Henderson, Farabow, Garrett & Dunner, L.L.P.

(57) ABSTRACT

A semiconductor device has a first conductor, a first insulating film formed on the first conductor, a columnar second conductor formed on the first conductor, and a third conductor formed on a top surface of the second columnar conductor and first insulating film. A second insulating film is formed on the third conductor and the first insulating film. The second insulating film is thinned above the second conductor. The second and third conductors form a fuse that is blown if irradiated with a laser beam. The fuse needs a small space, and a peripheral circuit related to the fuse is formed on one side of the fuse.

33 Claims, 16 Drawing Sheets

(PRIOR ART)

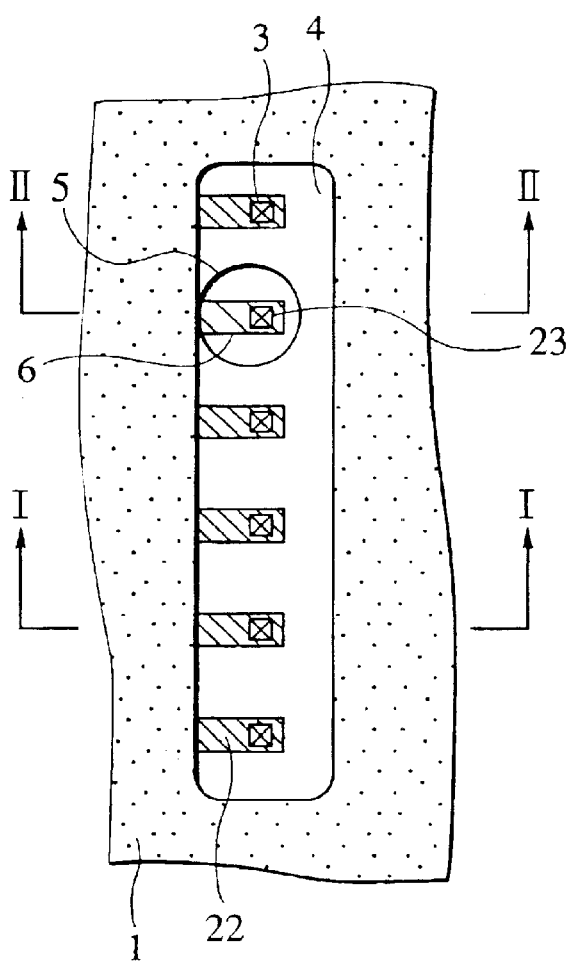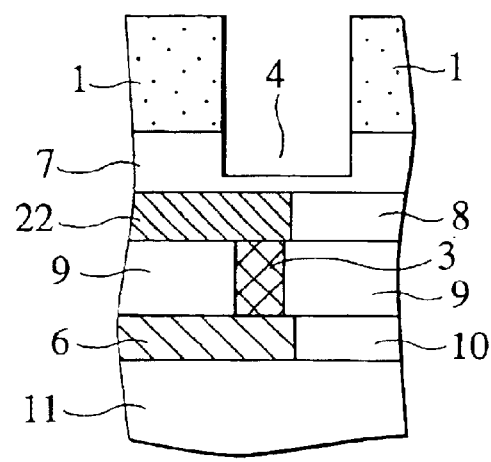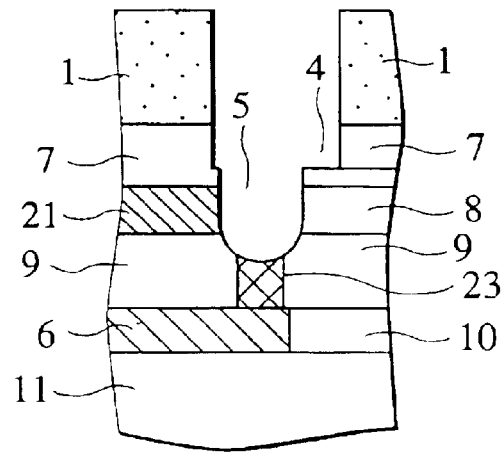
FIG.16A
FIG.16B
FIG.16C

SEMICONDUCTOR DEVICE WITH FUSE

CROSS REFERENCE TO RELATED APPLICATIONS

The subject application is related to subject matter disclosed in Japanese Patent Application No. Hei 11-67513 filed on Mar. 12, 1999 in Japan to which the subject application claims priority under the Paris Convention and which is incorporated herein by reference.

BACKGROUND OF THE INVENTION

1. Field of the Invention

The present invention relates to a semiconductor device such as a DRAM or an SRAM having a redundancy circuit, a semiconductor integrated circuit having a redundancy circuit, and a method of manufacturing a semiconductor device having a redundancy circuit. In particular, the present invention relates to the structure of a fuse to be blown by a laser beam to realize a relief function.

2. Description of the Related Art

Some semiconductor integrated circuits are provided with a redundancy function to cover a defective part. The redundancy function is realized by a redundancy circuit. The redundancy circuit in a DRAM or an SRAM replaces defective memory cells with redundant memory cells that arranged in a memory cell matrix. To generate a signal for replacing defective memory cells with redundant memory cells, fuses related to the redundancy circuit are blown by laser beams.

FIG. 1A is a partly-cut top view showing fuses according to a prior art, FIG. 1B is a sectional view taken along a line I—I of FIG. 1A, and FIG. 1C is a sectional view taken along a line II—II of FIG. 1A. To guide a laser beam for blowing a required fuse 2, an opening 4 is formed in a polyimide film 1. Each fuse 2 runs across the opening 4. Peripheral circuits including a redundancy circuit related to the fuses 2 are arranged around the opening 4. In FIG. 1B, each fuse 2 is formed on an insulating layer 9. On the fuse 2, a passivation layer 7 is formed. Under the opening 4, there are only the fuses 2, and no connection parts such as plugs or wiring are present under the opening 4. In FIG. 1C, a given fuse 2 is cut by irradiating it with a laser beam. The laser beam forms a blown part 5 to disconnect the fuse 2, when replacing a defective line with a redundant line.

According to the prior art, a pitch between adjacent fuses is determined by the diameter of a laser beam to blow each fuse, and therefore, an only way to reduce an area where the fuses are formed is to reduce the diameter of a laser beam. According to the prior art, each fuse involves circuits including a redundancy circuit at both ends of the fuse, and therefore, the periphery of the opening 4 for the fuses is crowded with such circuits to hinder miniaturization.

SUMMARY OF THE INVENTION

An object of the present invention is to provide a semiconductor device having a small fuse area with fuses densely arranged therein and peripheral circuits arranged on one side thereof.

Another object of the present invention is to provide a semiconductor integrated circuit having small fuses and fuse-related circuits on one side of each fuse.

Still another object of the present invention is to provide a method of manufacturing a semiconductor integrated circuit having small fuses and fuse-related circuits on one side of each fuse.

In order to accomplish the objects, a first aspect of the present invention provides a semiconductor device having a first conductor, a columnar second conductor having a bottom face that is in contact with a top face of the first conductor, a first insulating film for covering the first and second conductors, a linear third conductor formed on the first insulating film and having an end whose bottom face is in contact with a top face of the second conductor, and a second insulating film for covering the third conductor and first insulating film and having a thin area over the second conductor.

The thin area corresponds to an opening for guiding a laser beam and is formed by removing a polyimide film or by thinning a passivation film so that a fuse including the second and third conductors may easily be blown by a laser beam. This structure provides the following effects when a laser beam is emitted toward a contact face between the second and third conductors:

(1) The wavelength of the laser beam is set to the light absorbing band of the third conductor so that only the third conductor may be heated and blown without damaging the other conductors. To also blow the second conductor, the same material may be used for the second and third conductors, or the wavelength of the laser beam may be adjusted.

(2) The second and third conductors block the laser beam to reach the first conductor, thereby preventing the heating or damaging of the first conductor.

(3) The second conductor absorbs heat from the insulating films, to heat the second conductor itself. This makes the removing of the second conductor easier and suppresses the heating and damaging of the first conductor.

(4) The second conductor may be made from a material having low heat conductivity, or may be shaped to show large heat resistance, to suppress heat conduction in the second conductor. This may prevent the heating and damaging of the first conductor even if the temperature of the third conductor is increased. The material having low beat conductivity is, for example, tungsten, titanium, tantalum, and silicon. The second conductor may include a plurality of plugs having a laminated structure, or may have a shape of large aspect ratio. If the first conductor must be removed also, the first conductor may be made of a material having high heat conductivity, such as aluminum and copper.

(5) The second conductor may be made of a material having high melting and boiling points, to prevent the deformation of the second conductor and keep the shape of the first conductor. The material having high melting and boiling points is, for example, tungsten, titanium, tantalum, and silicon. To remove the second and first conductors, the material may be aluminum.

(6) After a shot of laser beam, the first insulating film secures an insulating distance corresponding to the length of the second conductor between a cut face of the third conductor and the first conductor.

The first to third conductors form a folded structure with the second conductor (plug) serving as a joint. This structure enables peripheral circuits including a redundancy circuit related to the first to third conductors to be arranged on one side thereof, thereby minimizing the semiconductor device. The fuse, which includes the second and third conductors, is easy to blow by irradiating a contact face between the second and third conductors with a laser beam. Since the fuse needs a small space, a plurality of fuses may be arranged in two rows. In this case, peripheral circuits related to the fuses are arranged on one side of each row. The fuses in two rows may be zigzagged, to reduce an area where the fuses are arranged.

When a fuse in the semiconductor device of the first aspect is blown, the first conductor under the first insulating film is exposed as a fourth conductor, and a cut face of the third conductor under the second insulating film is exposed as a sixth conductor, which is properly isolated from the fourth conductor. Below the thin area of the second insulating film, the first insulating film has an opening to expose the fourth conductor. Above the opening of the first insulating film, the second insulating film has an opening to expose the sixth conductor. Consequently, a distance corresponding to the length of the second conductor is secured as an isolation distance between the fourth and sixth conductors.

According to the first aspect, the fuse is mainly made of aluminum or copper. The aluminum has low melting and boiling points, and therefore, is blown at a low temperature. The copper has low electric resistance to form a thin fuse having a small volume to be blown.

A second aspect of the present invention provides a semiconductor integrated circuit having a latch circuit and first and second fuses arranged on a semiconductor substrate. The latch circuit holds data in response to a voltage applied to an input terminal. The first fuse has a first terminal connected to the input terminal of the latch circuit and is blown by a laser beam. The second fuse is formed under the first fuse and has a first terminal connected to a second terminal of the first fuse and a second terminal set at a predetermined voltage. The first fuse corresponds to the first or third conductor of the first aspect, and the second fuse corresponds to the second conductor. The fuses are properly blown by a laser beam.

A third aspect of the present invention provides a method of manufacturing a semiconductor device, having the steps of forming a first conductor, forming a first insulating layer and a columnar second conductor on the first conductor, forming a linear third conductor on the second conductor and first insulating film, forming a second insulating film over the third conductor and first insulating film, forming a thin area in the second insulating film over the second conductor, testing whether or not the first and second conductors must be disconnected from each other, and if they must be disconnected from each other, emitting a laser beam toward a contact face between the first and second conductors. The third aspect is capable of employing standard multilayer processes to form the second and third conductors serving as fuses.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIGS. 16A to 16C show fuses in a semiconductor device according to a seventh embodiment of the present invention.

DESCRIPTION OF THE PREFERRED EMBODIMENTS

Figure 1A:
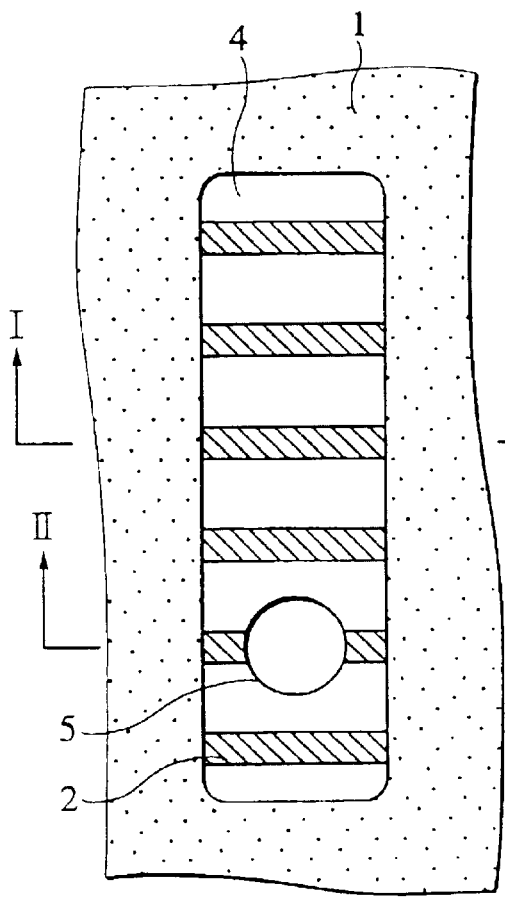
FIGS. 1A to 1C show fuses in a semiconductor device according to a prior art.
Figure 1B:
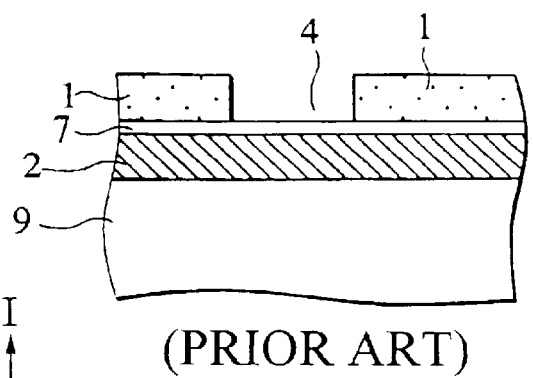
Figure 1C:
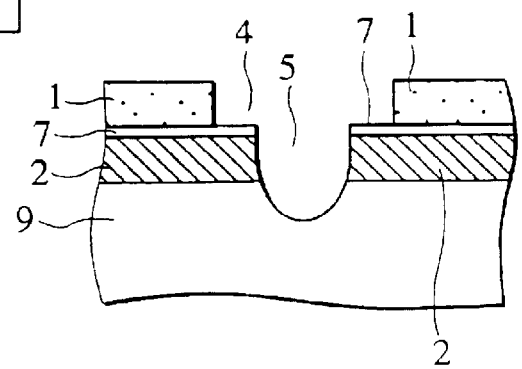

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular, that the layer thicknesses are arbitrarily drawn for facilitating the reading of the drawings.

First Embodiment

Figure 2A:
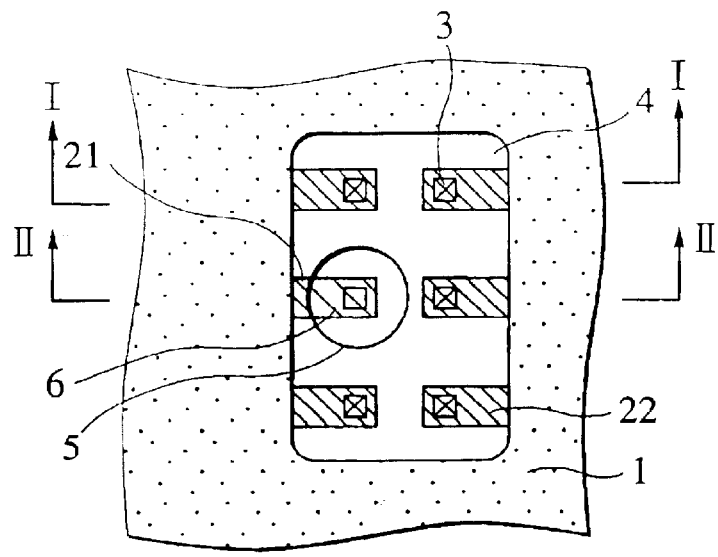
FIGS. 2A to 2C show fuses in a semiconductor device according to a first embodiment of the present invention.
Figure 2B:
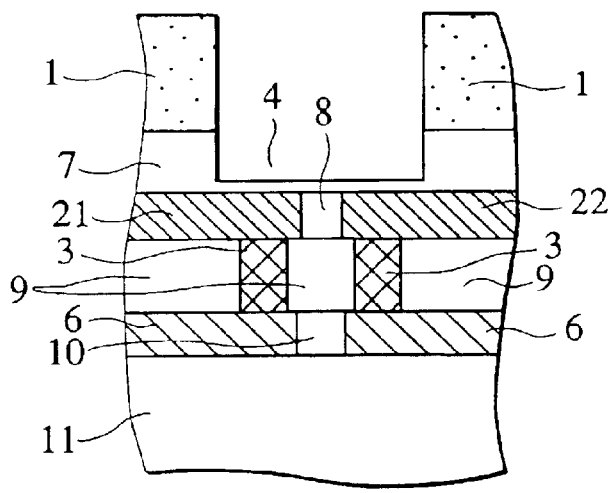
Figure 2C:
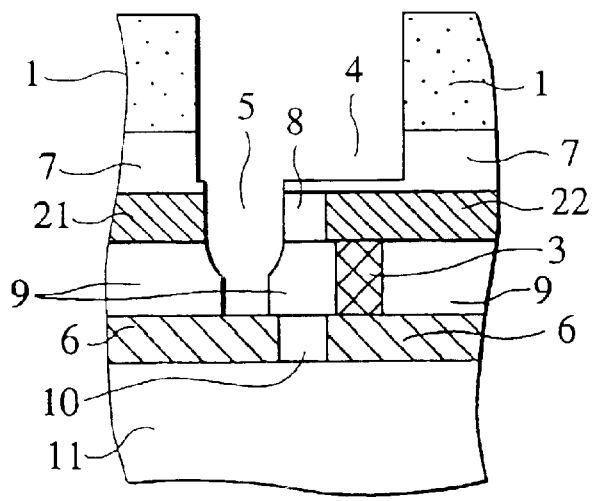

FIGS. 2A to 2C show fuses in a semiconductor device according to the first embodiment of the present invention, in which FIG. 2A is a top view partly cut to show parts positions, FIG. 2B is a sectional view taken along a line I—I of FIG. 2A, and FIG. 2C is a sectional view taken along a line II—II of FIG. 2A. Upper fuses 22 are selectively blown by a laser beam. Each upper fuse 22 has an end whose bottom face is in contact with a top face of a middle fuse 3. The middle fuse 3 has a bottom face that is in contact with a top face of a lower fuse 6. A passivation film 7 has a thin area over the upper fuses 22. On the passivation film 7, a polyimide film 1 is formed. The polyimide film 1 has an opening over the middle fuses 3. Each set of the upper fuse 22, middle fuse 3, and lower fuse 6 forms a folded fuse having a folded structure. In the following, the fuse with such folded structure is called the folded fuse. The folded fuses are arranged in two parallel rows.

FIG. 2B shows one of the folded fuses that is not blown. The folded fuse includes an interlayer insulating film 11, the lower fuse (wire) 6 formed on the insulating film 11, an insulating film 10 formed between wire 6 of the left side in the figure and wire 6 of the right side, an interlayer insulating film 9 formed on the lower wire 6 and insulating film 10, the middle fuse (tungsten plug) 3 formed on the lower wire 6 through the insulating film 9, the upper fuse (wire) 22 formed on the insulating film 9 and plug 3, an insulating film 8 formed around the upper wire 22, the passivation film 7 formed on the upper wire 22 and insulating film 8 and having the thin area, and the polyimide film 1 formed on the passivation film 7 and having the opening 4. The upper wire 22 is made of, for example, aluminum and is electrically connected to the lower wire 6 through the plug 3. The lower wire 6 is made of, for example, tungsten. The folded fuse including the upper wire 22, plug 3, and lower wire 6 is folded at the plug 3.

FIG. 2C shows one of the folded fuses blown by a laser beam. A blown part 5 is formed in the insulating films 7, 8, and 9. The upper wire 22 cut by the laser beam forms a cut wire 21, which is exposed at an upper part of the blown part 5. The lower wire 6 is exposed at the bottom of the blown part 5 and is disconnected from the cut wire 21. The plug 3 was blown and disappeared, to expose a side face of the insulating film 9. The cut wire 21 and disappeared plug 3 ensure isolation between two terminals of the folded fuse.

A method of manufacturing the semiconductor device of the first embodiment will be explained.

(1) An interlayer insulating film 11 is formed by chemical vapor deposition (CVD), and the surface thereof is leveled by chemical mechanical polishing (CMP).

Figure 3A:
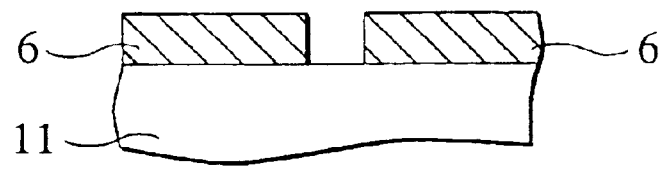
FIGS. 3A to 3C show the steps of manufacturing the semiconductor device of the first embodiment.

(2) In FIG. 3A, a tungsten film is formed to about 55 nm thick by physical vapor deposition (PVD) or CVD and is patterned into lower wires 6 each of about 500 nm wide. A pitch between adjacent wires 6 must be greater than the radius of a laser beam used to blow a fuse. If the diameter of a laser beam is 1.5 $\mu$m, the pitch will be 2 $\mu$m or larger.

(3) A silicon oxide film that serves as an insulating film 10 around the wires 6 and an interlayer insulating film 9 are formed to about 400 nm thick by CVD, and the surface of the film 9 is leveled by CMP.

(4) Square via holes each having a side length of 200 nm are formed through the insulating film 9 by reactive ion etching (RIE).

Figure 3B:
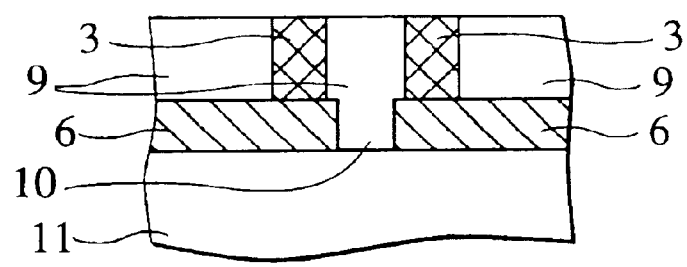

(5) A tungsten film is formed by CVD to fill the via holes. The, tungsten film on the insulating film 9 is removed by CMP, to complete plugs 3 as shown in FIG. 3B.

(6) An aluminum film is formed to about 300 nm thick by PVD and is patterned into upper wires 22. The width of each wire 22 and a pitch between adjacent wires 22 are the same as those of the lower wires 6.

Figure 3C:
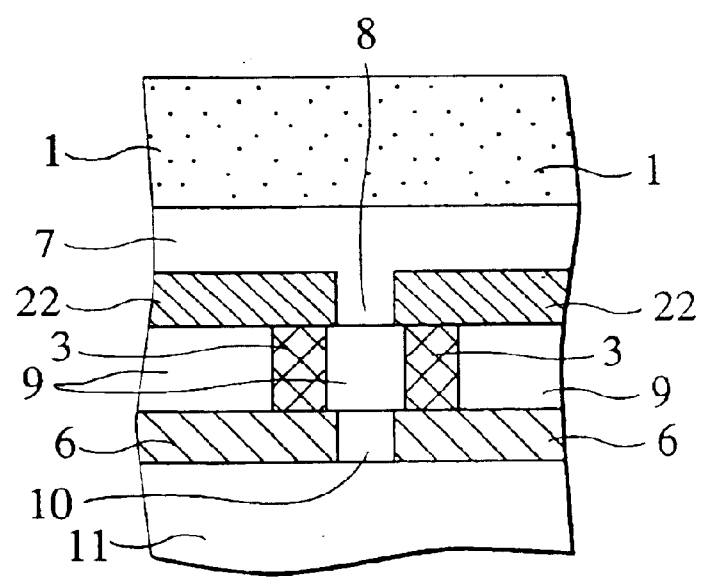

(7) A phosphorus glass film and a silicon nitride film are laminated by plasma CVD, to form an insulating film 8 around the wires 22 and a passivation film 7 over the wires 22. A polyimide film 1 is coated as shown in FIG. 3C.

(8) RIE is used to continuously form an opening 4 in the polyimide film 1 and a thin area in the passivation film 7. The thickness of the thin area is in the range of 100 nm to 500 nm. If the thickness is thinner than this range, it deteriorates the reliability of the upper wires 22, and if it is thicker than the range, it elongates a hole to be blown by a laser beam to increase the energy of the laser beam. The width of the opening 4 is about 7 $\mu$m to allow two shots of laser beam in the opening 4 in the width direction. The width of the opening 4 is dependent on the thickness of the polyimide film 1. If the film 1 is thick, the opening 4 must be wide.

(9) A test is carried out to determine whether or not any of the folded fuses must be blown.

(10) Any folded fuse that must be blown is irradiated with a laser beam. The laser beam is emitted from a laser trimmer toward a contact face between the upper wire 22 and the plug 3 of the folded fuse. The laser beam may have a diameter of about 3 $\mu$m, energy of 0.5 $\mu$J/shot to 2 $\mu$J/shot, and a wavelength above depending on the absorption band of aluminum that makes the upper wire 22. The laser beam of this wavelength may efficiently heat and evaporate the target upper wire 22, to form a blown part 5 as shown in FIG. 2C to disconnect the upper wire 22 from the lower wire 6. The radius of the plug 3 is quite smaller than that of the blown part 5, and therefore, the folded fuses may be blown at the intervals of the radius of the blown part 5. When blown, the plug 3 is completely removed from the via hole due to heat shock, and therefore, the insulating film 9 secures isolation between the upper wire 22 and the lower wire 6. By blowing any folded fuse, a corresponding defective bit line is replaced with a redundant bit line.

According to the first embodiment, the folded fuses are arranged in two rows, to halve the long side of the opening 4 compared with the prior art with a conventional laser beam diameter. According to the first embodiment, no folded fuse crosses the opening 4 and circuits related to the fuses are arranged along one side of the opening 4, to minimize the size of the semiconductor device. Since the lower wires 6 are present under the upper wires 22, the insulating layer 9 is protected from dishing by CMP.

Figure 4:
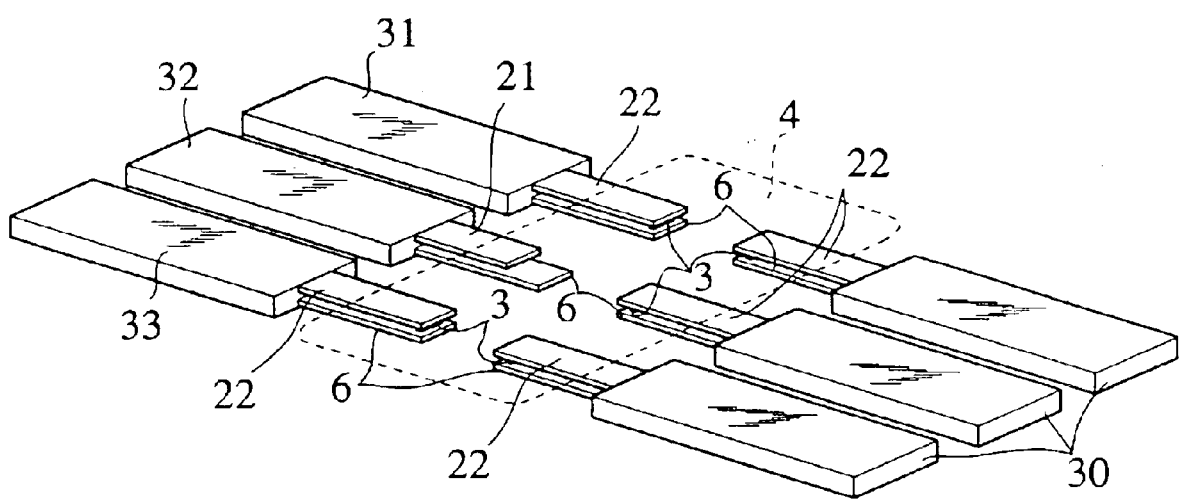
FIG. 4 shows an arrangement of fuses and latch circuits according to the first embodiment.

FIG. 4 shows an arrangement of folded fuses and latch circuits according to the first embodiment. Each folded fuse has an upper fuse 22, a middle fuse 3, and a lower fuse 6 that are connected in series. Insulating films around the fuses are not shown in FIG. 4. The upper fuses 22 and 21 and lower fuses 6 are connected to the latch circuits 30 to 33. Each latch circuit holds high or low potential according to whether or not the corresponding folded fuse is blown. The latch circuit 30 to 33 are formed on the semiconductor substrate and are not boxy. In FIG. 4, the latch circuit 30 to 33 are typically expressed in boxes. The folded fuses are arranged inside the opening 4 and the latch circuits are arranged outside the same. Each row of folded fuses involves a row of latch circuits along the outer side of the row of folded fuses. This arrangement is possible because each folded fuse has a folded structure. The folded fuse connected to the latch circuit 32 is blown. Namely, a part of the upper fuse and the middle fuse of this folded fuse are blown to disconnect the fuse. As a result, the latch circuit 32 holds different potential from the latch circuits 30, 31, and 33.

Figure 5:
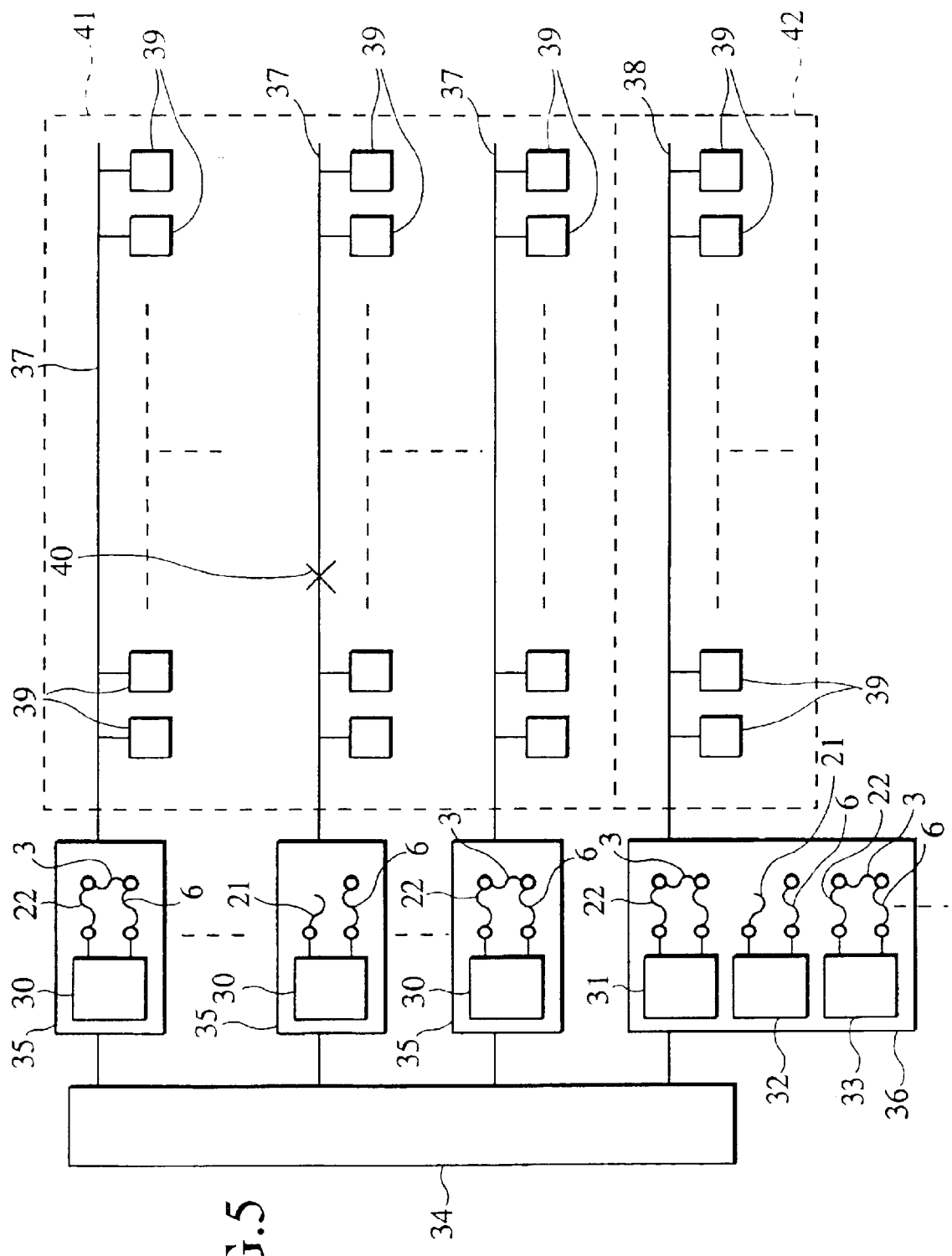
FIG. 5 shows a semiconductor integrated circuit according to the first embodiment.

FIG. 5 shows a semiconductor integrated circuit according to the first embodiment. This circuit is a memory. Memory cells 39 are connected to a word line 37, to form a memory cell array 41. Memory cells 39 connected to a redundant word line 38 form a redundant memory cell array 42, i.e., a redundant circuit. The redundant circuit may be made of redundant word lines, or redundant bit lines, or a combination of redundant word and bit lines.

Each word line 37 is connected to a driver 35, which is connected to a row decoder 34. Each driver 35 receives a select signal from the row decoder 34 and provides a control voltage to the word line 37, to read or write the memory cells 39. Each driver 35 is connected to a latch circuit 30. The latch circuit 30 is connected to an upper fuse 22, a middle fuse 3, and a lower fuse 6 in series. The fuses 22, 3, and 6 form a folded fuse.

The redundant word line 38 is connected to a redundancy circuit 36, which is connected to the row decoder 34. The redundancy circuit 36 is connected to latch circuits 31 to 33. The latch circuits 31 and 33 have each an upper fuse 22, a middle fuse 3, and a lower fuse 6 that are connected in series to form a folded fuse.

A defect 40 occurs on one of the word lines 37, which is replaced with the redundant word line 38. To achieve this, a folded fuse in the driver 35 of the defective word line 37 is blown to remove the defective word line 37 from the memory cell array. More precisely, a part of the upper fuse 22 and the middle fuse 3 are blown in the driver 35 of the defective word line 37. As a result, the output of the driver 35 in question is fixed at a disabled level so that the defective word line 37 may not be selected. Thereafter, the redundant word line 38 is activated. Namely, folded fuses in the redundancy circuit 36 are properly blown to adjust the address of the redundant word line 38 to that of the defective word line 37. In this example, a part of the upper fuse 21 and the middle fuse 3 connected to the latch circuit 32 are blown. As a result, the defective word line 37 is replaced with the redundant word line 38.

Figure 6A:
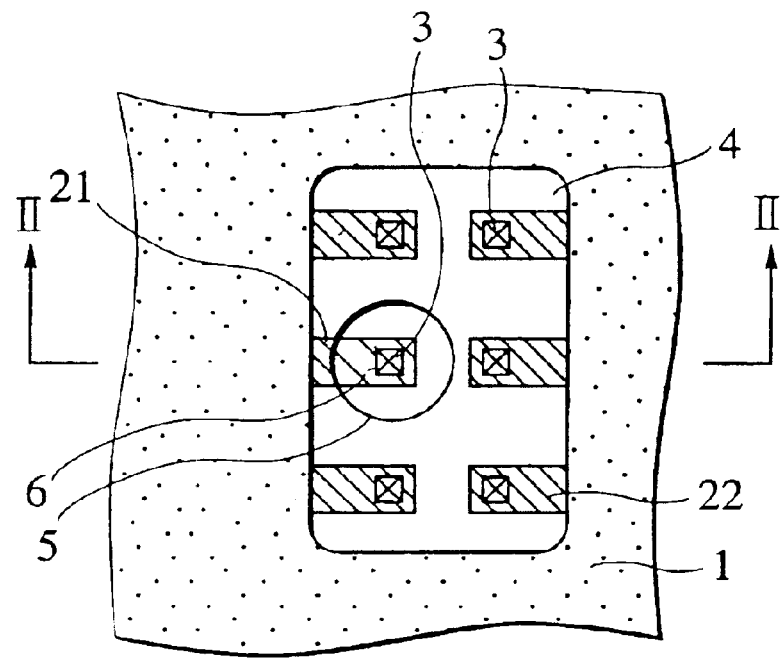
FIGS. 6A to 9B show various forms of blown fuses according to the first embodiment.
Figure 6B:
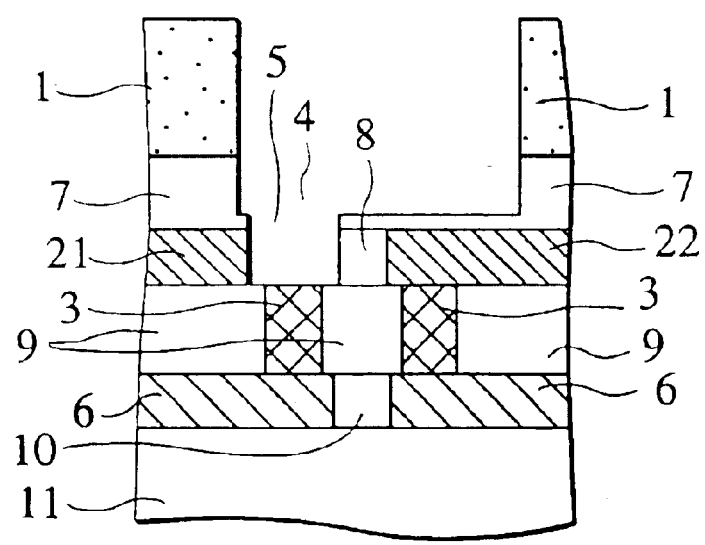

FIGS. 6A and 6B show an example of a blown shape of the folded fuse in the semiconductor device of the first embodiment. The middle fuse 3 is left as it is and a part of the upper fuse 22 is blown. This shape is effective to disconnect the folded fuse and is achievable by lowering the energy of a laser beam not to blow the middle fuse 3, or by thinning the thin area of the passivation film 7 so that the upper fuse 22 is blown with low energy, or by thinning the upper fuse 22 itself.

Figure 7A:
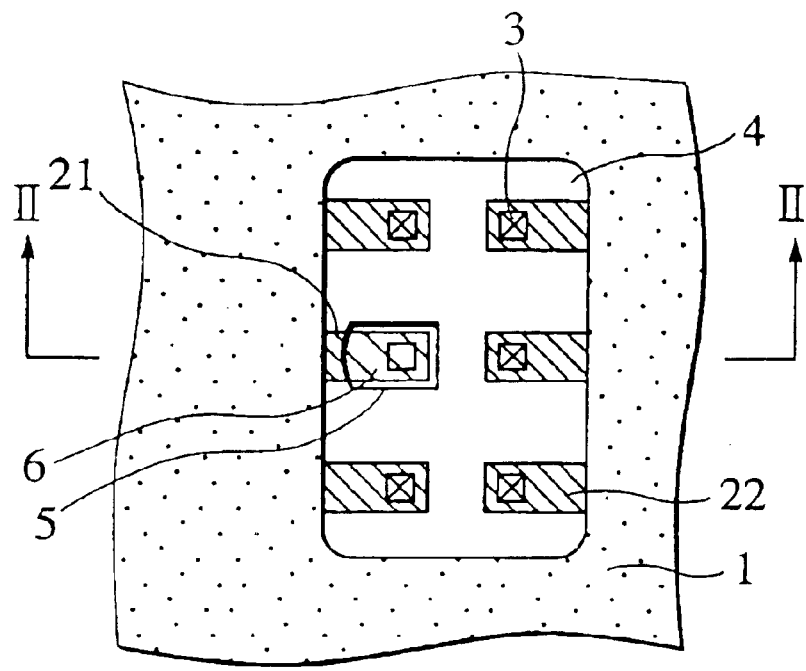
Figure 7B:
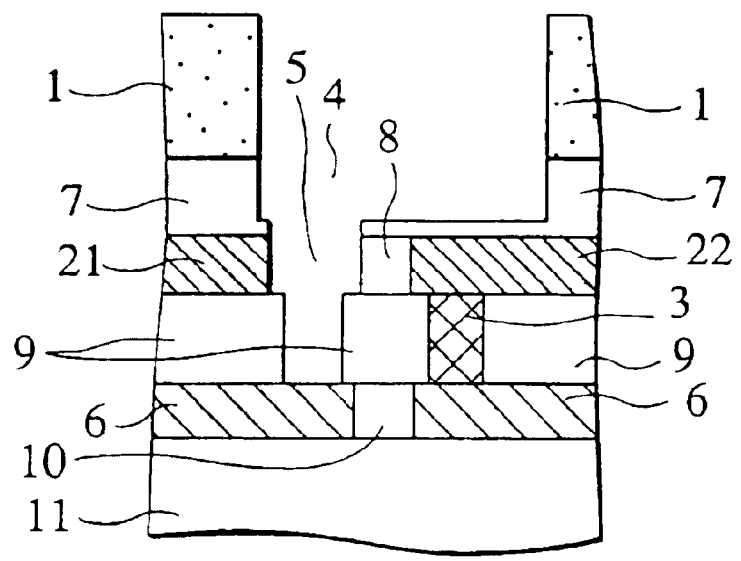

FIGS. 7A and 7B show another example of a blown shape of the folded fuse in the semiconductor device of the first embodiment. The insulating films 8 and 9 are left, and only a part of the upper fuse 22 and the middle fuse are blown. This shape is effective to disconnect the folded fuse and is achievable by sufficiently heating the fuse before the insulating films are heated. Namely, a laser beam of high energy density must be emitted for a short period. In addition, the middle fuse 3 may be made of the same material as the upper fuse 22, so that the middle fuse 3 is easily blown.

Figure 8A:
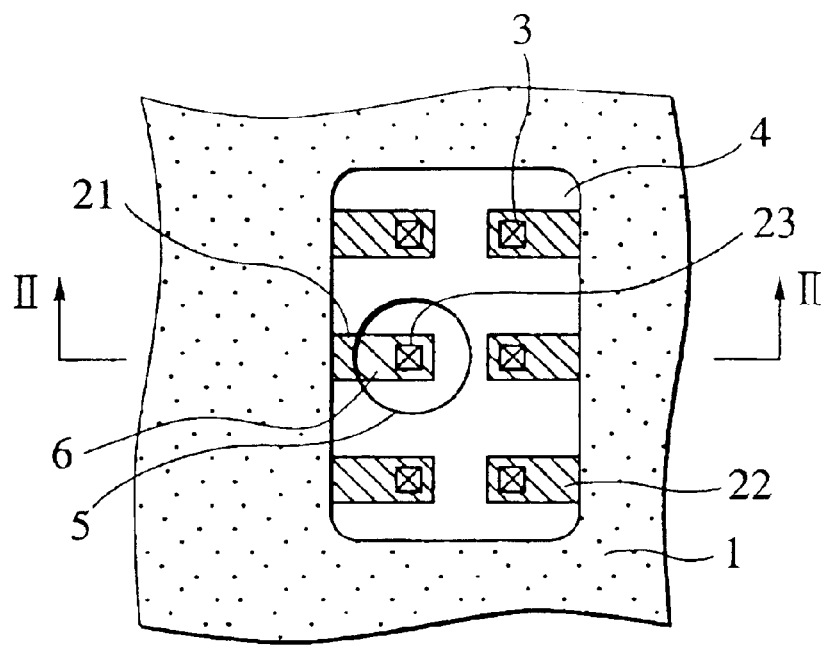
Figure 8B:
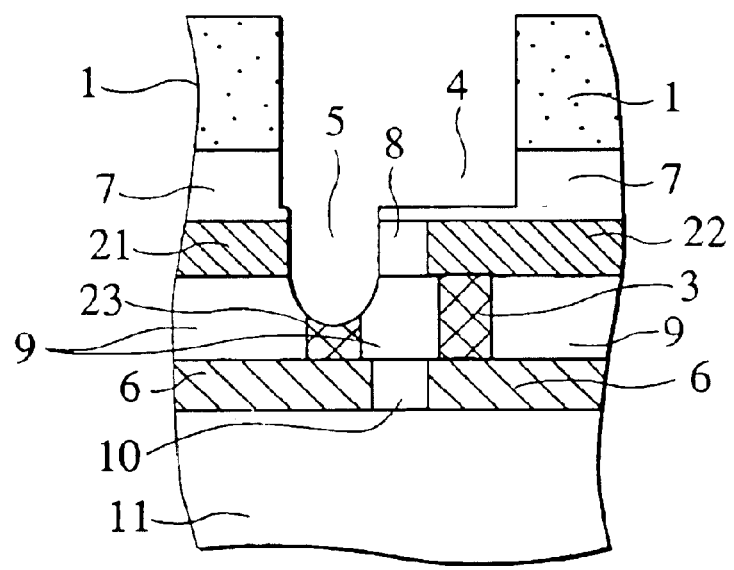

FIGS. 8A and 8B show still another example of a blown shape of the folded fuse in the semiconductor device of the first embodiment. This shape is dependent on the shape of the blown part 5 and is effective to surely disconnect the folded fuse. To achieve this shape, the insulating films 8 and 9 must sufficiently be heated by elongating a laser beam emitting period and lowering the energy density of the laser beam.

Figure 9A:
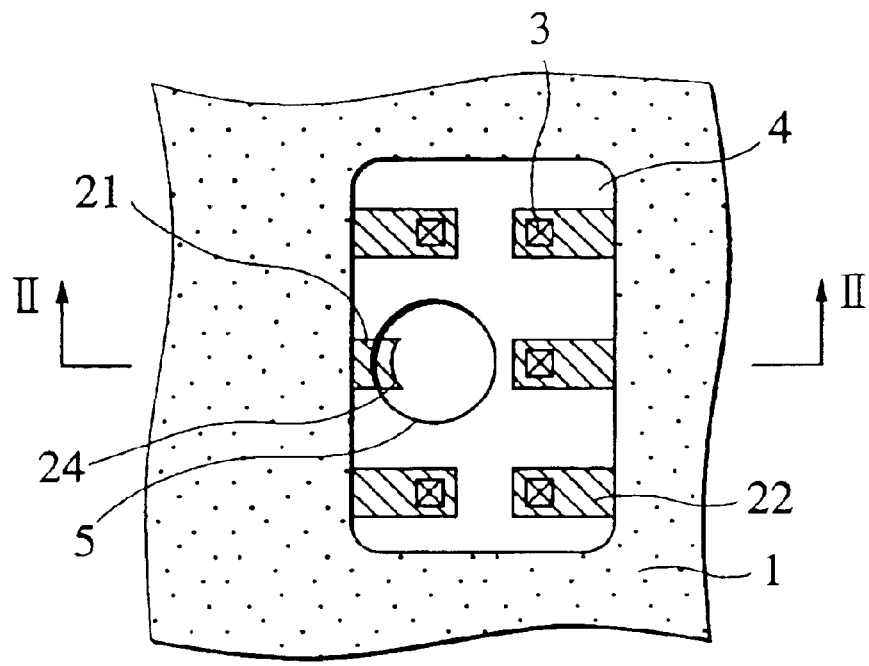
Figure 9B:
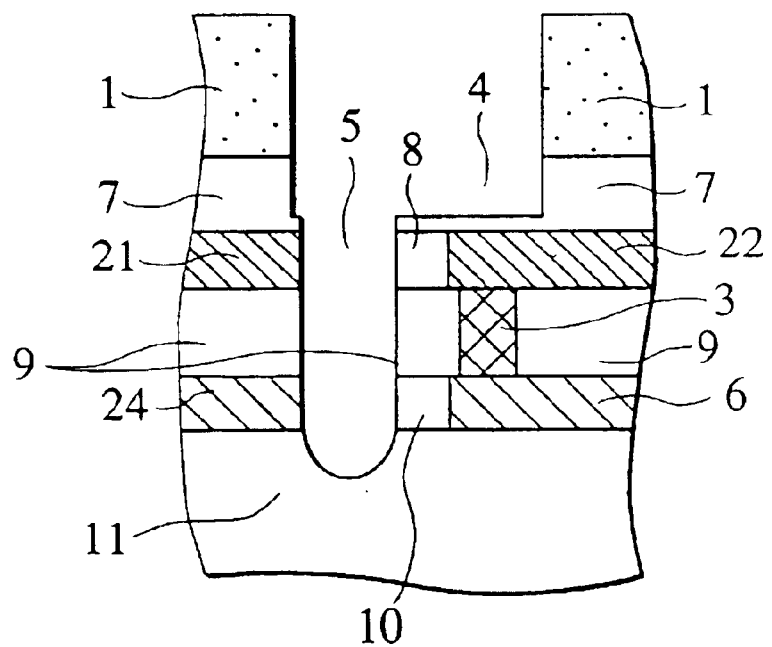

FIGS. 9A and 9B show still another example of a blown shape of the folded fuse in the semiconductor device of the first embodiment. This shape is dependent on the shape of the blown part 5 and is effective to surely disconnect the folded fuse. To achieve this blown shape, the insulating films 8 to 11 must sufficiently be heated. After forming the shape of FIG. 8B with a laser beam of low energy density, the laser beam must continuously be emitted for a long time.

Second Embodiment

Figure 10A:
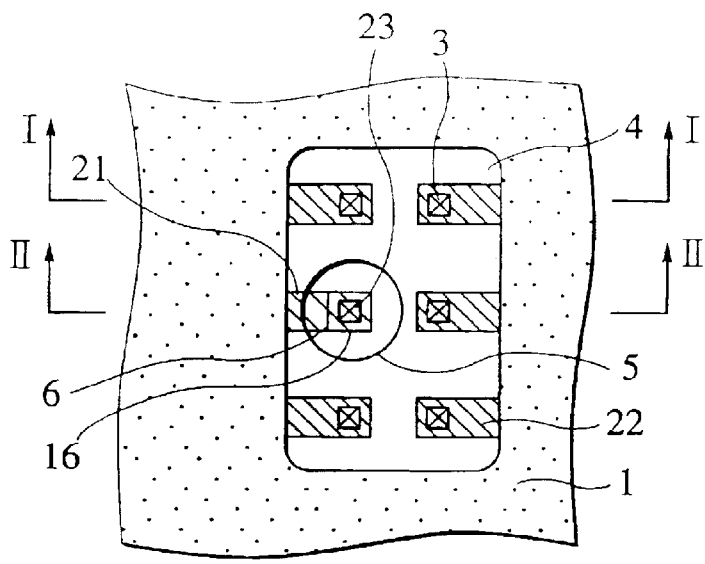
FIGS. 10A to 10C show fuses in a semiconductor device according to a second embodiment of the present invention.
Figure 10B:
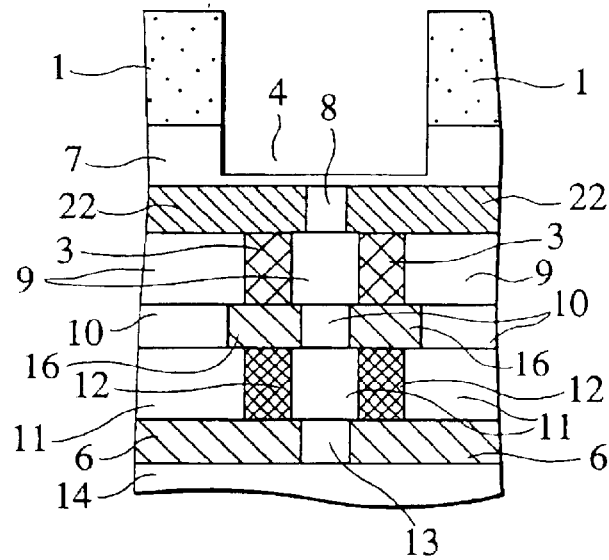
Figure 10C:
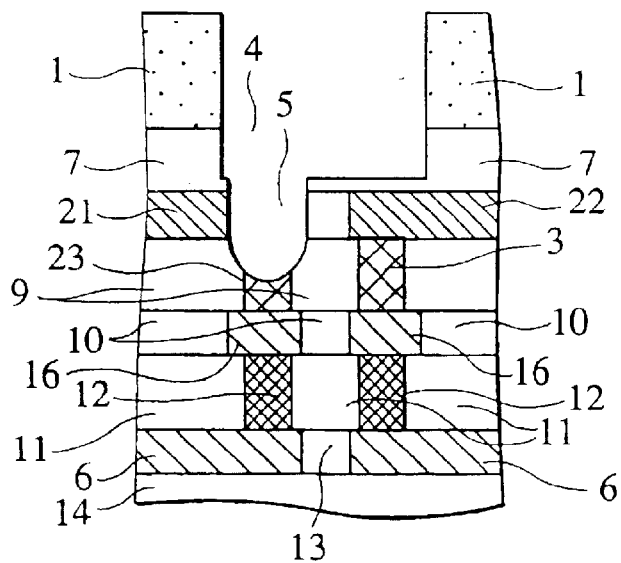

FIGS. 10A to 10C show folded fuses in a semiconductor device according to the second embodiment of the present invention, in which FIG. 10A is a top view partly cut to show parts positions, FIG. 10B is a sectional view taken along a line I—I of FIG. 10A, and FIG. 10C is a sectional view taken along a line II—II of FIG. 10A. An opening 4 for guiding a laser beam is formed in a polyimide film 1 and a passivation film 7. In the opening 4, the folded fuses are arranged in two rows. In FIG. 10B, each folded fuse includes an interlayer insulating film 14, a lower wire 6 of, for example, polysilicon formed on the insulating film 14, an insulating film 13 formed around the wire 6, an interlayer insulating film 11 formed on the wire 6 and insulating film 13, an aluminum plug 12 formed on the wire 6 through the insulating film 11, a middle wire 16 formed on the insulating film 11 and plug 12, an insulating film 10 formed around the wire 16, an interlayer insulating film 9 formed on the wire 16 and insulating film 10, an aluminum plug 3 formed on the wire 16 through the insulating film 9, an upper wire 22 formed on the plug 3 and insulating film 9, an insulating film 8 formed around the wire 22, the passivation film 7 formed on the wire 22 and insulating film 8, and the polyimide film 1 formed on the passivation film 7. The wire 22 serves as an upper fuse. The wire 6 serves as a lower fuse. The plugs 3 and 12 and middle wire 16 serve as a middle fuse. The upper, lower, and middle fuses form a folded fuse. The folded fuse is connected to a redundancy circuit such as a latch circuit. Any peripheral circuit such as the redundancy circuit related to a given folded fuse is arranged on one side of the opening 4. As shown in FIG. 10C, the plug 3 is blown to disconnect a cut upper fuse 21 (corresponding to the upper wire 22) from the plug 3, thereby replacing a defective bit line with a redundant bit line.

A method of manufacturing the semiconductor device of the second embodiment will be explained.

(1) An interlayer insulating film 14 is formed by CVD, and the surface of the film 14 is leveled by CMP.

(2) A polysilicon film is formed by CVD and is patterned into lower wires 6.

(3) An insulation film 13 around the wires 6 and interlayer insulating film 11 on the wires 6 are successively formed by CVD, and the surface of the insulating film 11 is leveled by CMP.

(4) Via holes are formed through the insulating film 11.

Figure 11A:
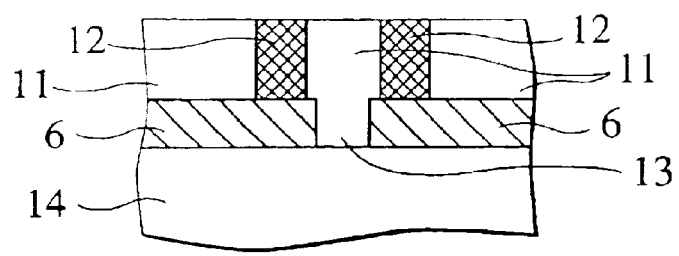
FIGS. 11A to 11C show the steps of manufacturing the semiconductor device of the second embodiment.

(5) An aluminum film is formed by PVD to fill the via holes, and the aluminum film on the insulating film 11 is removed by CMP, to complete plugs 12 as shown in FIG. 11A.

(6) An aluminum film is formed by PVD and is patterned into middle wires 16.

(7) An insulating film 10 around the wires 16 and an interlayer insulating film 9 on the wires 16 are successively formed by CVD, and the surface of the insulating film 9 is leveled by CMP.

(8) Via holes are formed through the insulating film 9.

Figure 11B:
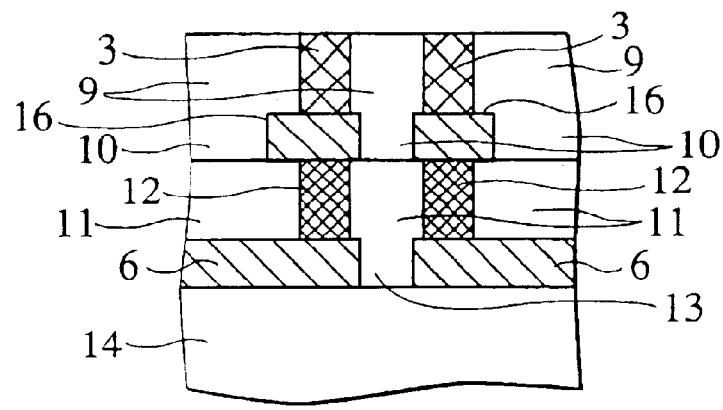

(9) An aluminum film is formed by PVD to fill the via holes, and the aluminum film on the insulating film 9 is removed by CMP, to complete plugs 3 as shown in FIG. 11B.

(10) An aluminum film is formed by PVD and is patterned into upper wires 22.

Figure 11C:
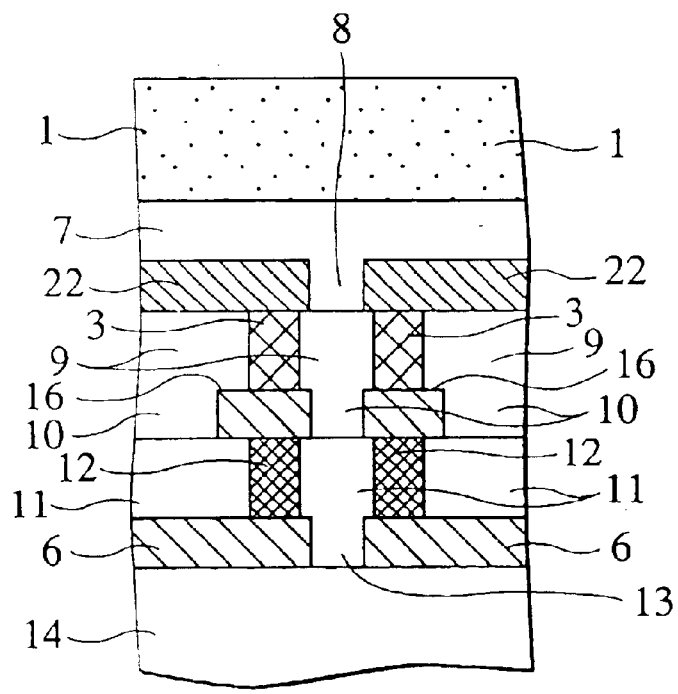

(11) An insulating film 8 around the wires 22 and a passivation film 7 on the wires 22 are successively formed by CVD, and a polyimide film 1 is coated as shown in FIG. 11C.

(12) An opening 4 is formed in the passivation film 1 as shown in FIG. 10B.

(13) A test is carried out to determine whether or not any folded fuse must be blown.

(14) Any folded fuse that must be blown is irradiated with a laser beam. The laser beam is directed toward a contact face between the plug 3 and the wire 22 of the folded fuse, to blow the wire 22.

In addition to the effect of the first embodiment, the second embodiment provides an effect of enabling the plugs 3 and 12 to be made from aluminum or copper. This is because the lower wire 6 is sufficiently distanced .from the upper wire 22, so that the wires 6 and 22 are never short-circuited to each other when the upper wire 22 is blown. The numbers of plugs 3 and 12 and middle wire 16 between the wires 22 and 6 are optional.

Third Embodiment

Figure 12A:
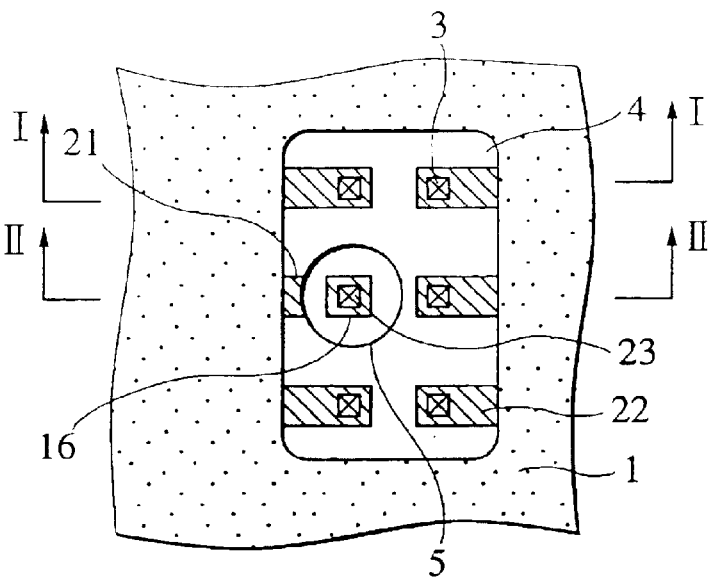
FIGS. 12A to 12C show fuses in a semiconductor device according to a third embodiment of the present invention.
Figure 12B:
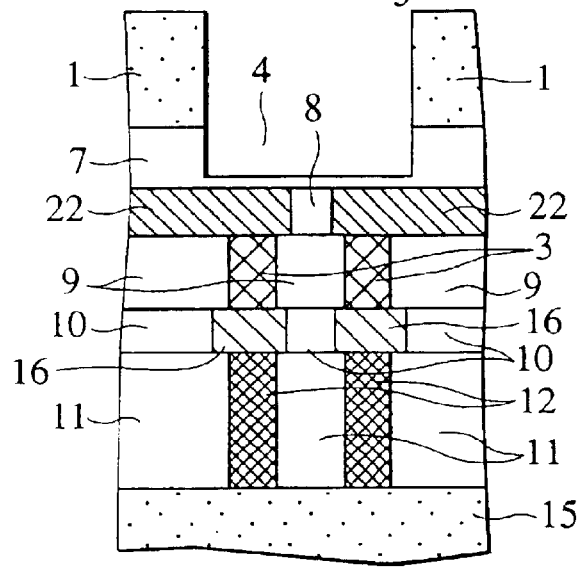
Figure 12C:
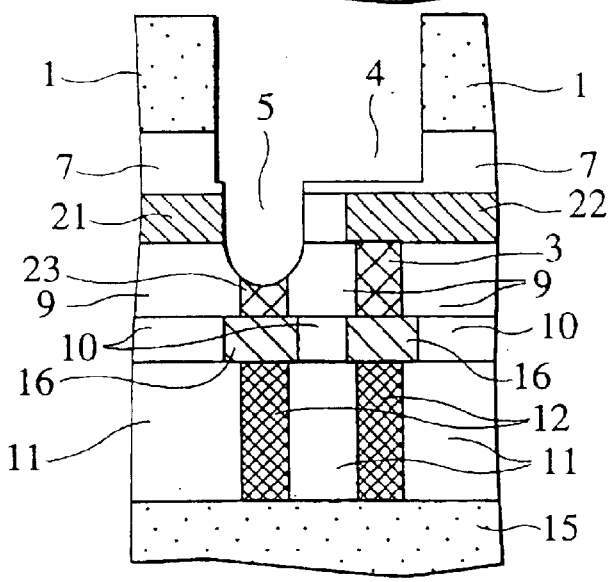

FIGS. 12A to 12C show fuses in a semiconductor device according to the third embodiment of the present invention, in which FIG. 12a is a top view partly cut to show parts positions, FIG. 12B is a sectional view taken along a line I—I of FIG. 12A, and FIG. 12C is a sectional view taken along a line II—II of FIG. 12A. An opening 4 is formed in a polyimide film 1 and a passivation film 7. In the opening 4, upper wires 22 of folded fuses are arranged in two rows. In FIG. 12B, an interlayer insulating film 11 and tungsten plugs 12 are formed on a semiconductor substrate 15. On the insulating film 11 and plugs 12, middle wires 16 and an insulating film 10 are formed. On the wires 16 and insulating film 10, an interlayer insulating film 9 and aluminum plugs 3 are formed. On the insulating film 9 and plugs 3, upper wires 22 and an insulating film 8 are formed. On the wires 22 and insulating film 8, the passivation film 7 and polyimide film 1 are formed. The wires 22 serve as upper fuses. Each set of the plugs 12 and 3 and middle wire 16 forms a middle fuse. Each set of the upper fuse and middle fuse forms a folded fuse. Each wire 22 is connected to the semiconductor substrate 15 through the plug 3, middle wire 16, and plug 12. In FIG. 12C, the wire 22 on the plug 3 is blown to disconnect the wire 22 from the plug 3, thereby replacing a defective bit line with a redundant bit line.

The third embodiment is used to connect the fuses of a semiconductor device to a common potential level such as a ground potential level and provides the same effect as the second embodiment.

Fourth Embodiment

Figure 13A:
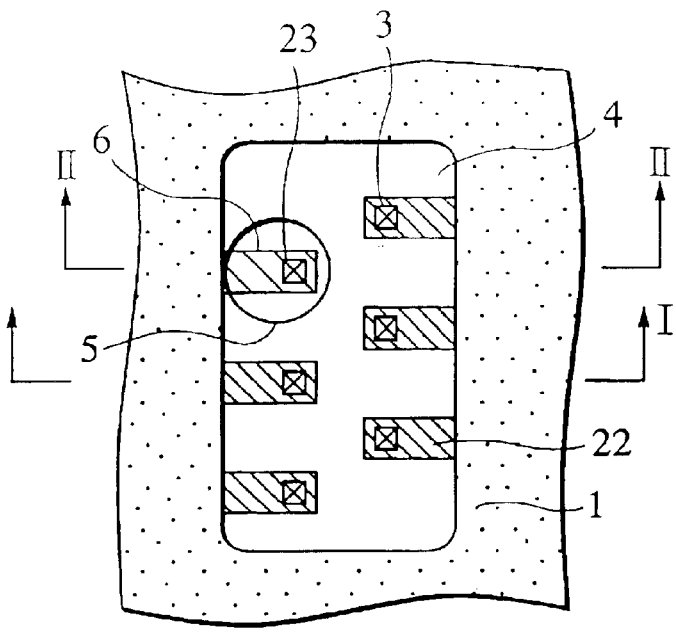
FIGS. 13A to 13C show fuses in a semiconductor device according to a fourth embodiment of the present invention.
Figure 13B:
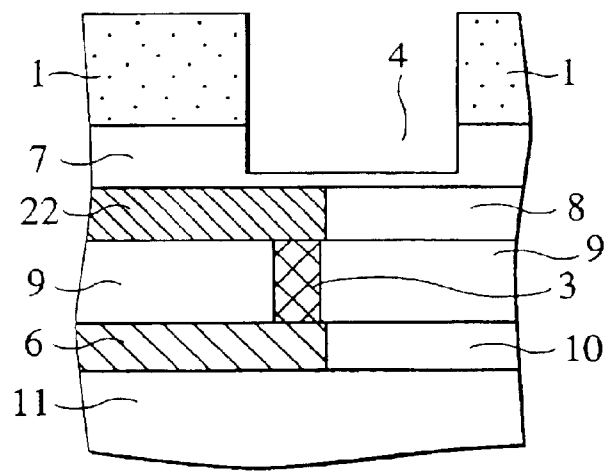
Figure 13C:
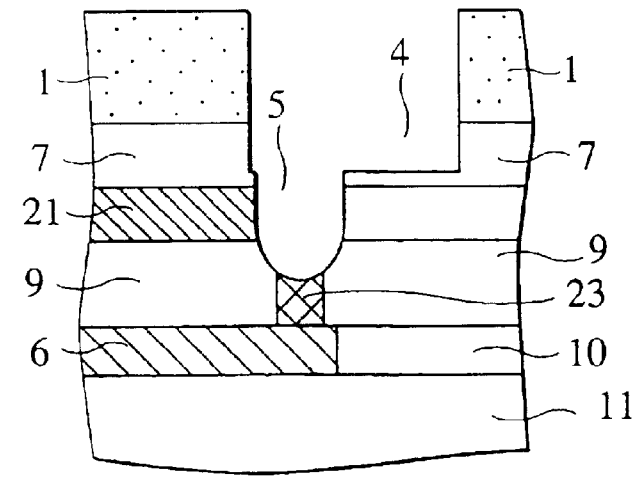

FIGS. 13A to 13C show fuses in a semiconductor device according to the fourth embodiment of the present invention, in which FIG. 13A is a lop view partly cut to show parts positions, FIG. 13B is a sectional view taken along a line I—I of FIG. 13A, and FIG. 13C is a sectional view taken along a line II—II of FIG. 13A. An opening 4 for guiding a laser beam is formed in a polyimide film 1 and a passivation film 7. Upper wires 22 are alternately as shown in FIG. 13A. A section of each folded fuse of the fourth embodiment is the same as that of the first embodiment, as is apparent from a comparison between FIGS. 13B and 2B. In FIG. 13C, a plug 3 is blown to disconnect the plug 3 from the wire 22, to replace a defective bit line with a redundant bit line. In addition to the effect of the first embodiment, the fourth embodiment provides an effect of reducing the short side of the opening 4.

Fifth Embodiment

Figure 14A:
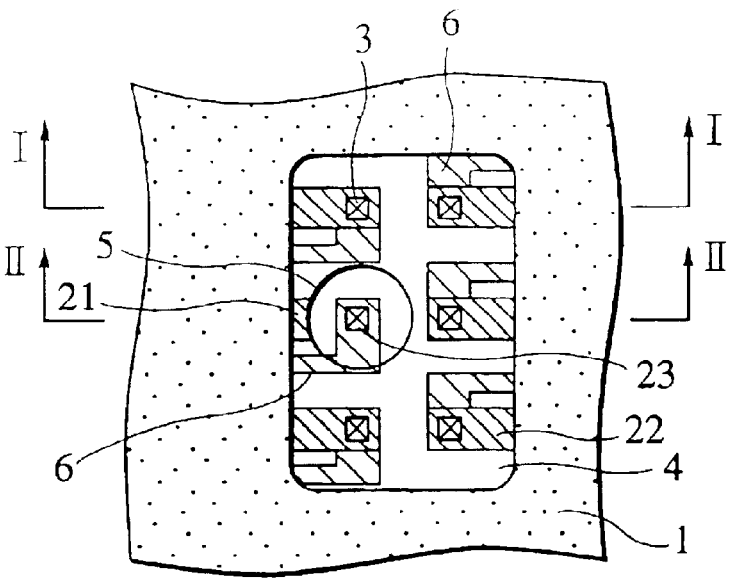
FIGS. 14A to 14C show fuses in a semiconductor device according to a fifth embodiment of the present invention.
Figure 14B:
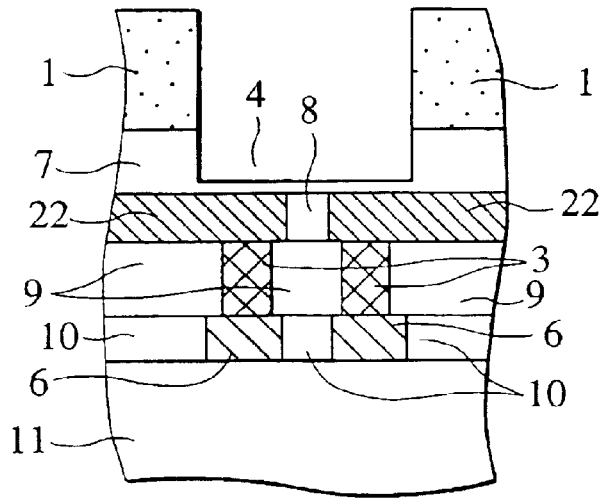
Figure 14C:
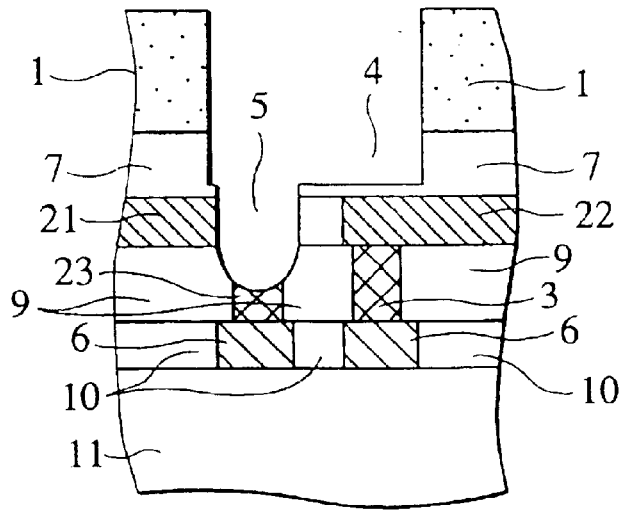

FIGS. 14A to 14C show fuses in a semiconductor device according to the fifth embodiment of the present invention, in which FIG. 14A is a top view partly cut to show parts positions, FIG. 14B is a sectional view taken along a lien I—I of FIG. 14A, and FIG. 14C is a sectional view taken along a line II—II of FIG. 14A. An opening 4 is formed in a polyimide film 1 and a passivation film 7. Folded fuses are arranged in two rows in the opening 4. In each of the folded fuses, a lower wire 6 is shifted from an upper wire 22 except a part under a plug 3. The shifts between the wires 6 and 22 of the folded fuses may be to the left, or to the right, or to the right and left. A section of each folded fuse of the fifth embodiment is the same as that of the first embodiment as is apparent from a comparison between FIGS. 14B and 2B. The upper wire 22 on the plug 3 in any folded fuse may be blown as shown in FIG. 14C, to disconnect the wire 22 from the plug 3, when replacing a defective bit line with a redundant bit line. In addition to the effect of the first embodiment, the fifth embodiment provides an effect of surely preventing a short circuit between the upper wire 22 and the lower wire 6 of any folded fuse after a part of the upper wire 22 is blown.

Sixth Embodiment

Figure 15A:
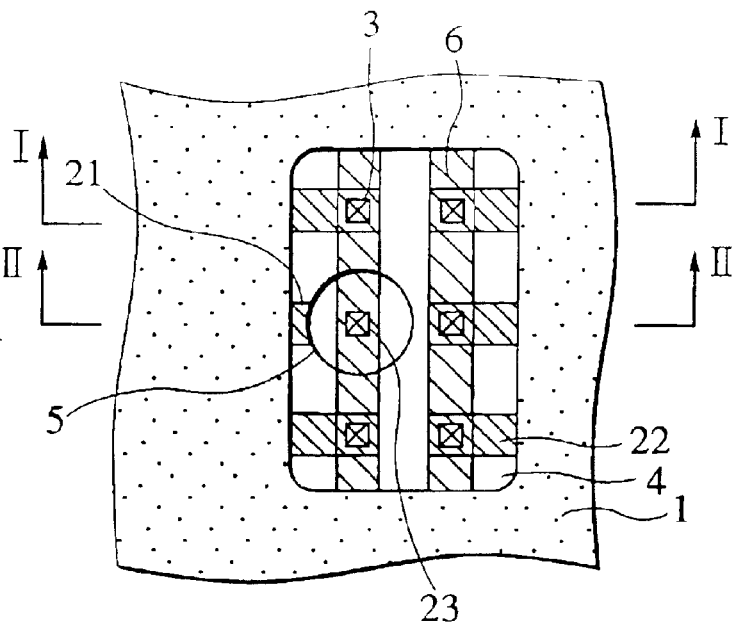
FIGS. 15A to 15C show fuses in a semiconductor device according to a sixth embodiment of the present invention.
Figure 15B:
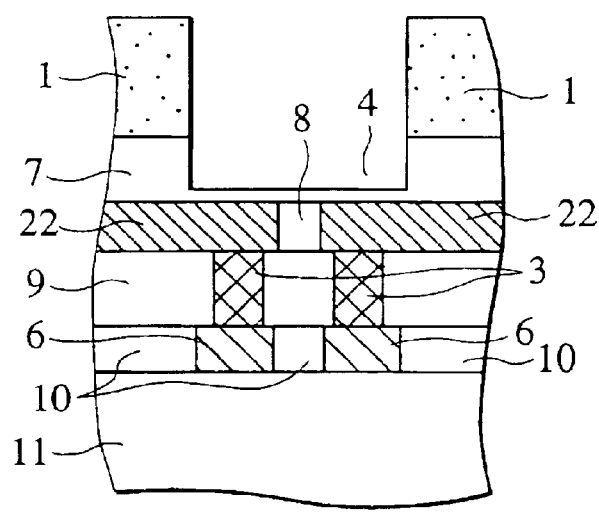
Figure 15C:
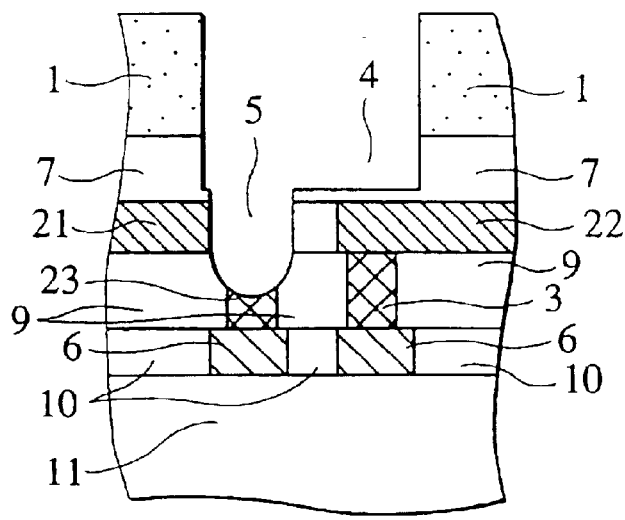

FIGS. 15A to 15C show fuses in a semiconductor device according to the sixth embodiment of the present invention, in which FIG. 15A is a top view partly cut to show parts positions, FIG. 15B is a sectional view taken along a line I—I of FIG. 15A, and FIG. 15C is a sectional view taken along a line II—II of FIG. 15A. An opening 4 is formed in a polyimide film 1 and a passivation film 7, and folded fuses are arranged in two rows. In each row, upper wires 22 are connected to plugs 3, which are linearly arranged and are connected to a lower wire 6. The lower wire 6 is linear and has a length to cover all of the plugs 3 in the corresponding row. A section of each folded fuse of the sixth embodiment is the same as that of the first embodiment as is apparent from a comparison between FIGS. 15B and 2B. The upper wire 22 on the plug 3 in any folded fuse may be blown to disconnect the wire 22 from the plug 3, when replacing a defective bit line with a redundant bit line. In addition to the effect of the first embodiment, the sixth embodiment provides an effect of providing a large margin when connecting the plug 3 to the lower wire 6. Namely, the plug 3 of the sixth embodiment is easy to form.

Seventh Embodiment

FIGS. 16A to 16C show fuses in a semiconductor device according to the seventh embodiment of the present invention, in which FIG. 16A is a top view partly cut to show parts positions, FIG. 16B is a sectional view taken along a line I—I of FIG. 16A, and FIG. 16C is a sectional view taken along a line II—II of FIG. 16A. An opening 4 is formed in a polyimide film 1 and a passivation film 7. Folded fuses are arranged in the opening 4 along one side of the opening 4, and therefore, peripheral circuits related to the folded fuses are arranged on one side of the opening 4 in the vicinity of upper wires 22. The peripheral circuits are connected to the upper wires 22 and lower wires 6. As is apparent from a comparison between FIGS. 16B and 2B, a section of each folded fuse of the seventh embodiment is the same as that of the first embodiment except that the seventh embodiment involves a single row of folded fuses. In FIG. 16C, the upper wire 22 on a plug 3 of a given folded fuse is blown to disconnect the upper wire 22 from the plug 3, when replacing a defective bit line with a redundant bit line. In addition to the effect of the first embodiment, the seventh embodiment provides an effect of arranging peripheral circuits related to folded fuses on one side of the opening 4, so that the folded fuse structure, which is usually arranged in a central area of a semiconductor device, may be arranged at an end of a semiconductor device. This results in improving the degree of integration of peripheral circuits and reducing the short side of the opening 4.

Other Embodiments

Various modifications will become possible for those skilled in the art after receiving the teachings of the present disclosure without departing from the scope thereof.

In the above embodiments, an upper wire of a folded fuse is provided with a single plug. Instead, each upper wire may be provided with a plurality of plugs that are arranged in parallel with each other. In this case, the plugs related to one upper wire must be close to each other so that they are blown by a single shot of laser beam.

In the above embodiments, one end of an upper wire of a folded fuse is connected to a plug. Instead, each end of an upper wire of a folded fuse may be connected to a plug. In this case, the distance between the plugs is made smaller than the diameter of a laser beam, so that the upper wire, or the upper wire and plugs are blown by a shot of laser beam. The number of plugs to be connected to the ends of an upper wire is optional.

In summary, the present invention provides a semiconductor device having small fuses arranged in two rows with peripheral circuits related to the fuses being arranged along one side of the respective rows.

The present invention also provides a semiconductor integrated circuit having small fuses arranged in two rows with peripheral circuits related to the fuses being arranged along one side of the respective rows.

The present invention further provides a method of manufacturing a semiconductor device having small fuses arranged in two rows with peripheral circuits related to the fuses being arranged along one side of the respective rows.

What is claimed is:

1. A semiconductor device comprising:

a first conductor;

a first insulating film formed on said first conductor, a second conductor including a first plug and a second plug formed on said first conductor through said first insulating film;

a third conductor including a first wire formed on said first insulating film and the first plug and a second wire formed on an extension line of the first wire on said first insulating film and the second plug; and a second insulating film formed on said third conductor and over said first insulating film, said second insulating film including a thin area over said second conductor for guiding a laser beam.

2. The semiconductor device of claim 1, wherein:

said second conductor includes a third plug and a fourth plug formed on said first conductor through said first insulating film; and said third conductor includes a third wire formed parallel with the first wire on said first insulating film and the third plug and a fourth wire formed on an extension line of the third wire on said first insulating film and the fourth plug.

3. The semiconductor device of claim 2, wherein:

said second conductor includes a fifth plug lined up on a first straight line with the first plug and the third plug on said first conductor through said first insulating film and a sixth plug lined up on a second straight line with the second plug and the fourth plug on said first conductor through said first insulating film.

4. The semiconductor device of claim 1, wherein:

the first conductor has a wire shape.

5. The semiconductor device of claim 4, wherein:

the first conductor is in contact with a plurality of the second conductors.

6. The semiconductor device of claim 4, wherein:

an end of the first conductor is in contact with the second conductor; and the first conductor is in parallel with the third conductor.

7. The semiconductor device of claim 6, wherein:

the first conductor is just under the third conductor.

8. The semiconductor device of claim 6, wherein the first conductor is obliquely below the third conductor.

9. The semiconductor device of claim 1, wherein:

the first conductor is a semiconductor substrate.

10. The semiconductor device of claim 1, wherein:

the first conductor is set at a predetermined potential level.

11. The semiconductor device of claim 1, wherein:

the third conductor is set at a predetermined potential level.

12. The semiconductor device of claim 1, wherein:

the third conductor is mainly made of one of aluminum and copper.

13. The semiconductor device of claim 1, wherein:

the second conductor is mainly made of one of aluminum, tungsten, silicon, titanium, tantalum, and copper.

14. The semiconductor device of claim 1, wherein:

the second conductor includes a first portion formed on said first conductor and a second portion formed on the first portion made of different material from that of the first portion.

15. The semiconductor device of claim 1, wherein:

the first conductor is mainly made of one of aluminum, tungsten, silicon, titanium, tantalum, and copper.

16. The semiconductor device of claim 1, further comprising:

a fourth conductor formed under the first insulating film below the thin area, a columnar fifth conductor having a bottom face that is in contact with a top face of the fourth conductor, the fifth conductor being formed below the thin area and passing through the first insulating film; and a sixth conductor formed on the first insulating film under the second insulating film and separated from the fifth conductor, wherein:

the second insulating film has an opening above the fifth conductor.

17. The semiconductor device of claim 16, wherein:

the height of the fifth conductor is equal to the height of the second conductor.

18. The semiconductor device of claim 16, wherein:

the height of the fifth conductor is lower than the height of the second conductor.

19. The semiconductor device of claim 1, further comprising:

a fourth conductor formed under the first insulating film below the thin area; and a sixth conductor formed on the first insulating film under the second insulating film and separated from the fourth conductor, wherein:

the first insulating film has an opening on the fourth conductor below the thin area; and the second insulating film has an opening above the opening of the first insulating film.

20. The semiconductor device of claim 19, wherein:

the opening of the first insulating film has taper angles that are small on the fourth conductor side and large on the sixth conductor side.

21. The semiconductor device of claim 1, further comprising:

a fourth conductor formed under the first insulating film; and a sixth conductor formed on the first insulating film under the second insulating film and separated from the fourth conductor, wherein:

the first insulating film has an opening below the thin area; and the second insulating film has an opening above the opening of the first insulating film.

22. A semiconductor device comprising:

a first insulating film;

a first lower wire formed on said first insulating film;

a second insulating film formed on said first lower wire;

a first conductor formed through said second insulating film including a first portion formed on said first lower wire and a second portion formed on the first portion made of a different material from that of the first portion;

a first upper wire formed parallel with said first lower wire on said second insulating film and said first conductor; and a third insulating film formed on said first upper wire and over said second insulating film, said third insulating film including a thin area over said first conductor for guiding a laser beam.

23. The semiconductor device of claim 22, further comprising:

a second lower wire formed on an extension line of said first lower wire on said first insulating film beneath said second insulating film;

a second conductor formed through said second insulating film below the thin area including a third portion formed on said second lower wire made of a same material as the first portion and a fourth portion formed on the third portion made of a same material as the second portion; and a second upper wire formed parallel with said second lower wire on said second insulating film and said second conductor beneath said third insulating film.

24. The semiconductor device of claim 22, wherein said first lower wire is obliquely below said first upper wire.

25. A semiconductor device comprising:

a semiconductor substrate;

a first insulating film formed on said semiconductor substrate;

a first conductor formed on said semiconductor substrate through said first insulating film, including a first portion formed on said semiconductor substrate and a second portion formed on the first portion made of different material from that of the first portion;

a first upper wire formed on said first insulating film and said first conductor; and a second insulating film formed on said first upper wire and over said first insulating film, said second insulating film including a thin area over said first conductor for guiding a laser beam.

26. A semiconductor device comprising:

a semiconductor substrate;

a first insulating film formed on said semiconductor substrate;

first conductors formed on said semiconductor substrate through said first insulating film;

first upper wires formed on said first insulating film and said first conductors alternated on two parallel lines such that ends of said first upper wires on one of the parallel lines oppose ends of said first upper wires on the other of the parallel lines; and a second insulating film formed on said first upper wires and over said first insulating film, said second insulating film including a thin area over said first conductors for guiding a laser beam, wherein said first conductors include first portions formed on said semiconductor substrate and second portions formed on the first portions made of different material from that of the first portions.

27. A semiconductor device comprising:

a first insulating film;

first lower wires formed on said first insulating film alternated on two parallel rows such that ends of said first lower wires on one of the parallel rows oppose ends of said first lower wires on the other of the parallel rows;

a second insulating film formed on said first lower wires;

first conductors formed on said first lower wires through said second insulating film;

first upper wires formed parallel with said first lower wires on said second insulating film and said first conductors; and a third insulating film formed on said first upper wires and over said second insulating film, said third insulating film including a thin area over said first conductors for guiding a laser beam.

28. The semiconductor device of claim 27, wherein said first conductors include first portions formed on said first lower wires and second portions formed on the first portions made of different material from that of the first portions.

29. The semiconductor device of claim 27, wherein said first lower wires are obliquely below said first upper wires being able to conduct to said first lower wires.

30. A semiconductor device comprising:

a first insulating film;

a first lower wire formed on said first insulating film;

a second insulating film formed on said first lower wire;

a first conductor formed on said first lower wire through said second insulating film;

a second conductor formed on said first lower wire through said second insulating film;

a first upper wire formed on said second insulating film and said first conductor;

a second upper wire formed parallel with said first upper wire on said second insulating film and said second conductor; and a third insulating film formed on said first upper wire and said second upper wire and over said second insulating film, said third insulating film including a thin area over said first conductor and said second conductor for guiding a laser beam.

31. The semiconductor device of claim 30, further comprising:

a second lower wire formed parallel with said first lower wire on said first insulating film beneath said second insulating film;

a third conductor formed on said second lower wire below the thin area through said second insulating film;

a fourth conductor formed on said second lower wire below the thin area through said second insulating film;

a third upper wire formed on an extension line of said first upper wire of said second insulating film and said third conductor beneath said third insulating film; and a fourth upper wire formed on an extension line of said second upper wire on said second insulating film and said fourth conductor beneath said third insulating film.

32. The semiconductor device of claim 30, wherein said first conductor includes a first portion formed on said first lower wire and a second portion formed on the first portion made of different material from that of the first portion.

33. The semiconductor device of claim 31, wherein
said first, second, third and fourth upper wires are alternated on two parallel rows such that ends of said first and second upper wires on one of the parallel rows oppose to ends of said third and fourth upper wires on the other of the parallel rows.

* * * * *